(12) United States Patent
Kawaguchi et al.

(10) Patent No.: US 8,368,098 B2
(45) Date of Patent: Feb. 5, 2013

(54) LIGHT EMITTING DEVICE AND MANUFACTURING METHOD THEREOF

(75) Inventors: Yoshinobu Kawaguchi, Mihara (JP); Takeshi Kamikawa, Mihara (JP)

(73) Assignee: Sharp Kabushiki Kaisha, Osaka-Shi (JP)

( * ) Notice: Subject to any disclaimer, the term of this patent is extended or adjusted under 35 U.S.C. 154(b) by 0 days.

(21) Appl. No.: 12/153,314

(22) Filed: May 16, 2008

(65) Prior Publication Data

US 2008/0303051 A1 Dec. 11, 2008

(30) Foreign Application Priority Data

Jun. 5, 2007 (JP) ................................ 2007-149422

(51) Int. Cl.
*H01L 33/44* (2010.01)
*H01L 21/329* (2006.01)
*H01S 5/028* (2006.01)

(52) U.S. Cl. ................ 257/98; 257/99; 438/26; 438/29; 372/43.01; 372/49.01

(58) Field of Classification Search .................... 257/79, 257/80, 81, 82, 83, 88, 93, E31.099, E31.105; 438/22, 29, 69; 372/49.01, 43.01, 44.01
See application file for complete search history.

(56) References Cited

U.S. PATENT DOCUMENTS

| | | | |
|---|---|---|---|
| 5,777,792 A | 7/1998 | Okada et al. | |
| 5,841,584 A | 11/1998 | Takatani et al. | |
| 6,249,534 B1 * | 6/2001 | Itoh et al. | 372/49.01 |
| 6,667,187 B2 | 12/2003 | Genei et al. | |
| 6,744,076 B2 | 6/2004 | Fukuyama et al. | |
| 6,812,152 B2 | 11/2004 | Lindström et al. | |
| 6,991,952 B2 | 1/2006 | Mizuno et al. | |
| 7,164,148 B2 | 1/2007 | Yoshida et al. | |
| 2002/0006726 A1 | 1/2002 | Yamasaki et al. | |
| 2002/0024981 A1 | 2/2002 | Tojo et al. | |
| 2002/0075928 A1 * | 6/2002 | Genei et al. | 372/49 |
| 2003/0015713 A1 | 1/2003 | Yoo | |

(Continued)

FOREIGN PATENT DOCUMENTS

| | | |
|---|---|---|
| JP | 8-298351 | 11/1996 |
| JP | 09-162496 | 6/1997 |

(Continued)

OTHER PUBLICATIONS

Office Action dated Aug. 3, 2009 from copending U.S. Appl. No. 11/638,582.

(Continued)

*Primary Examiner* — Olik Chaudhuri
*Assistant Examiner* — Su Kim
(74) *Attorney, Agent, or Firm* — Harness, Dickey & Pierce, P.L.C.

(57) ABSTRACT

The present invention provides a light emitting device loaded with a light emitting semiconductor chip with a protective film formed on a light emitting portion, in which the protective film contains a first dielectric film formed of aluminum oxynitride, a second dielectric film formed of silicon nitride or silicon oxynitride, and a third dielectric film formed of an oxide or a fluoride, the first dielectric film is located more toward the light emitting portion than the second dielectric film, and the second dielectric film is located more toward the light emitting portion than the third dielectric film, and a manufacturing method of the light emitting device.

13 Claims, 10 Drawing Sheets

U.S. PATENT DOCUMENTS

| | | | |
|---|---|---|---|
| 2003/0015715 A1 | 1/2003 | Sakai | |
| 2003/0156614 A1* | 8/2003 | Ueda et al. | 372/49 |
| 2003/0178711 A1 | 9/2003 | Honda et al. | |
| 2003/0210722 A1* | 11/2003 | Arakida et al. | 372/49 |
| 2004/0165635 A1 | 8/2004 | Sugimoto et al. | |
| 2004/0238810 A1 | 12/2004 | Dwilinski et al. | |
| 2004/0245535 A1 | 12/2004 | D'Evelyn et al. | |
| 2005/0032344 A1 | 2/2005 | Hatano et al. | |
| 2005/0059181 A1 | 3/2005 | Yamane et al. | |
| 2005/0127383 A1* | 6/2005 | Kikawa et al. | 257/98 |
| 2005/0281304 A1* | 12/2005 | Mochida | 372/46.01 |
| 2006/0159146 A1 | 7/2006 | Iwayama et al. | |
| 2007/0177646 A1* | 8/2007 | Sogabe et al. | 372/49.01 |
| 2007/0205410 A1* | 9/2007 | Ikeda et al. | 257/40 |
| 2007/0290378 A1* | 12/2007 | Coffin et al. | 257/791 |

FOREIGN PATENT DOCUMENTS

| | | | |
|---|---|---|---|
| JP | 2000-349389 | | 12/2000 |
| JP | 2002-043672 | | 2/2002 |
| JP | 2003-264333 | | 9/2003 |
| JP | 2004-040051 | | 2/2004 |
| JP | 2004-289010 | | 10/2004 |
| JP | 2005-175111 | | 6/2005 |
| JP | 2005-340625 | * | 8/2005 |
| JP | 2005-340625 | | 12/2005 |
| JP | 2006-186228 | | 7/2006 |
| JP | 2007-027260 | | 2/2007 |
| JP | 2007-189201 | | 7/2007 |

OTHER PUBLICATIONS

Office Action dated Jan. 25, 2010 from copending U.S. Appl. No. 12/153,756.
Office Action dated Jan. 26, 2010 from copending U.S. Appl. No. 11/638,582.
Office Action dated Feb. 26, 2010 from copending U.S. Appl. No. 11/638,581.
Advisory Action dated Apr. 21, 2010 from copending U.S. Appl. No. 11/638,582.
Office Action dated May 24, 2010 from copending U.S. Appl. No. 11/638,581.
Office Action dated May 26, 2010 from copending U.S. Appl. No. 12/382,530.
Office Action dated May 26, 2010 from copending U.S. Appl. No. 12/314,402.
Hartnett, et al., "*Optical properties of ALON (aluminum oxynitride)*", Infrared Physics & Technology, vol. 39, pp. 203-211 (1998).
Dreer, et al., "*Statistical evaluation of refractive index, growth rate, hardness and Young's modulus of aluminium oxynitride films*", Thin Solid Films, vol. 354, pp. 43-49 (1999).
Office Action dated Jun. 17, 2010 from copending U.S. Appl. No. 12/153,756.
Office Action mailed Oct. 4, 2010 from copending U.S. Appl. No. 11/638,581.
Office Action mailed Oct. 7, 2010 from copending U.S. Appl. No. 12/382,530.
Office Action mailed Oct. 13, 2010 from copending U.S. Appl. No. 12/153,756.
Office Action mailed Nov. 24, 2010 from co-pending U.S. Appl. No. 12/213,686.
Office Action mailed Dec. 6, 2010 from co-pending U.S. Appl. No. 12/314,402.
Office Action mailed Jul. 20, 2011 issued in co-pending U.S. Appl. No. 12/153,756.
Office Action mailed Mar. 18, 2011 from co-pending U.S. Appl. No. 12/153,756.
Office Action mailed Mar. 21, 2011 from co-pending U.S. Appl. No. 12/213,686.
Office Action mailed Apr. 22, 2011 from co-pending U.S. Appl. No. 12/382,530.
Office Action mailed Apr. 26, 2011 from co-pending U.S. Appl. No. 11/638,581.
Office Action mailed May 2, 2011 from co-pending U.S. Appl. No. 12/805,644.
Office Action mailed Jun. 23, 2011 from co-pending U.S. Appl. No. 12/314,402.
US Office Action mailed Mar. 29, 2012 issued in co-pending U.S. Appl. No. 11/638,582.
US Office Action mailed Apr. 27, 2012 issued in co-pending U.S. Appl. No. 13/200,357.
US Advisory Action mailed Oct. 4, 2011 issued in co-pending U.S. Appl. No. 12/314,402.
US Office Action mailed Nov. 15, 2011 issued in co-pending U.S. Appl. No. 12/153,756.
US Office Action mailed Oct. 13, 2011 issued in co-pending U.S. Appl. No. 11/638,581.
US Office Action mailed Oct. 7, 2011 issued in co-pending U.S. Appl. No. 11/638,582.
US Office Action mailed Oct. 7, 2011 issued in co-pending U.S. Appl. No. 12/382,530.
US Office Action mailed Nov. 9, 2011 issued in co-pending U.S. Appl. No. 12/314,402.
US Office Action mailed Feb. 28, 2012 issued in co-pending U.S. Appl. No. 12/314,402.
US Advisory Action mailed Jan. 30, 2011 issued in co-pending U.S. Appl. No. 11/638,581.

* cited by examiner

LIGHT EMITTING DEVICE AND MANUFACTURING METHOD THEREOF

This nonprovisional application is based on Japanese Patent Application No. 2007-149422 filed with the Japan Patent Office on Jun. 5, 2007, the entire contents of which are hereby incorporated by reference.

BACKGROUND OF THE INVENTION

1. Field of the Invention

The present invention relates to a light emitting device and a manufacturing method of the light emitting device, and especially relates to a light emitting device that is capable of suppressing deterioration in characteristics and improving reliability and a manufacturing method of the light emitting device.

2. Description of the Related Art

A light emitting device loaded with a light emitting semiconductor chip is often hermetically sealed with a package with the light emitting semiconductor chip being loaded on a base. However, because hermetical sealing of the light emitting semiconductor chip with a package becomes an obstacle in miniaturizing the light emitting device, there is a case that a light emitting device is desired in which the hermetic sealing with a package is not necessary.

Further, there is a merit in omitting a hermetic sealing step with a package from the viewpoint of reducing the manufacturing cost of the light emitting device. For example, a semiconductor laser device with a light emitting wavelength of 780 nm used in a CD (Compact Disk) or a semiconductor laser device with a light emitting wavelength of 650 nm used in a DVD (Digital Versatile Disk) is loaded in a state in which hermetic sealing called as frame package is not performed when miniaturization is required.

Further, there is a case that the light emitting semiconductor chip is hermetically sealed with a package together with an optical element depending on use. In this case, an adhesive containing an organic substance is used in adhesion of the optical element in the package, for example.

However, in a semiconductor laser device having a light emitting wavelength of about 405 nm that has appeared in recent years, it is known that a deposition containing silicon (Si) and oxygen (O) is formed at the light emitting edge of the semiconductor laser chip and remarkable deterioration in characteristics occurs in the case of hermetically sealing the adhesive containing an organic substance and the semiconductor laser chip in a package (for example, refer to Japanese Patent Laying-Open No. 2004-289010).

A result of actually performing a continuous driving test of the semiconductor laser device in which the adhesive containing an organic substance and the semiconductor laser chip having a light emitting wavelength of about 405 nm were hermetically sealed in a package is shown in FIG. 14. Here, the continuous driving test was performed using an apparatus for the continuous driving test of the semiconductor laser device in a mode of controlling the driving current value so that the light output at a temperature of 75° C. becomes constant at 15 mW (APC mode). As shown in FIG. 14, a large change in the driving current value is seen that is considered to be caused by formation of the deposition onto the light emitting edge of the semiconductor laser chip.

Such formation of the deposition onto the light emitting edge of the semiconductor laser chip occurs in a semiconductor laser device having a light emitting wavelength of 550 nm or less not only by the adhesive containing an organic substance, but also by an organic substance attaching in the manufacturing process of the semiconductor laser device, and induces characteristic deterioration of the semiconductor laser device (for example, refer to Japanese Patent Laying-Open No. 2004-040051).

The phenomenon as described above is a phenomenon that cannot be seen in a light emitting device having a light emitting wavelength of 650 nm or more.

SUMMARY OF THE INVENTION

A technique of preventing formation of the deposition onto the light emitting edge of the semiconductor laser chip by lowering the vapor pressure of an Si organic compound gas in a package is disclosed in Japanese Patent Laying-Open No. 2004-289010, for example. However, in the technique disclosed in Japanese Patent Laying-Open No. 2004-289010, in the case that the adhesive containing an organic substance has to be used when it is necessary to hermetically seal the semiconductor laser chip together with the optical element, it is extremely difficult to lower the vapor pressure of the Si organic compound gas in the package and even if it is possible, a complex manufacturing process is necessary.

Further, a technique is disclosed in Japanese Patent Laying-Open No. 2004-040051 of preventing formation of the deposition onto the light emitting edge of the semiconductor laser chip by irradiating light with a shorter wavelength than the light emitting wavelength of the semiconductor laser chip onto a base loaded with the semiconductor laser chip. However, the manufacturing process becomes complex also in the technique disclosed in Japanese Patent Laying-Open No. 2004-040051.

Furthermore, it was found that the deposition is formed on the surface of a protective film on a light emitting portion of the semiconductor laser chip also in the case of using the semiconductor laser chip in a state of being exposed to the atmosphere without covering the chip with a package in a semiconductor laser chip with a light emitting wavelength of 400 nm to 437 nm. Such a phenomenon is a phenomenon that can not be seen in the semiconductor laser chip with a light emitting wavelength of 780 nm or 650 nm. This phenomenon means that a frame package used in the above-described small size CD and DVD cannot be used with a semiconductor laser chip with a short light emitting wavelength. Formation of the deposition brings about a disorder in the shape of the emitted light, deterioration in the light emitting portion during high output driving, and deterioration in characteristics such as the threshold current value and differential efficiency, and causes a decrease in reliability of the semiconductor laser device loaded with the semiconductor laser chip.

Formation of the deposition as described above can be seen remarkably in a semiconductor laser chip in which the light density of the emitted light is high. However, because it is considered that formation of the deposition naturally happens in the case that the light emitting wavelength is short also in other light emitting semiconductor chips such as a light emitting diode, it is considered to be a problem of all light emitting devices loaded with a light emitting semiconductor chip with a short light emitting wavelength.

Accordingly, an object of the present invention is to provide a light emitting device that is capable of suppressing the deterioration in characteristics and improving reliability and a manufacturing method of the light emitting device.

The present invention provides a light emitting device loaded with a light emitting semiconductor chip with a protective film formed on the light emitting portion, in which the light emitting semiconductor chip is not hermetically sealed, the protective film contains a first dielectric film formed of aluminum oxynitride, a second dielectric film formed of silicon nitride or silicon oxynitride, and a third dielectric film formed of an oxide or a fluoride, the first dielectric film is located more toward the light emitting portion than the second dielectric film, and the second dielectric film is located more toward the light emitting portion than the third dielectric film.

Here, a light emitting semiconductor chip can be loaded in the light emitting device of the present invention in a state of a frame package.

Further, the present invention provides a light emitting device loaded with a light emitting semiconductor chip with a protective film formed on the light emitting portion, in which the light emitting semiconductor chip is hermetically sealed with an adhesive containing an organic substance, the protective film contains a first dielectric film formed of aluminum oxynitride, a second dielectric film formed of silicon nitride or silicon oxynitride, and a third dielectric film formed of an oxide or a fluoride, the first dielectric film is located more toward the light emitting portion than the second dielectric film, and the second dielectric film is located more toward the light emitting portion than the third dielectric film.

Further, the light emitting semiconductor chip in the light emitting device of the present invention preferably contains a nitride III-V group compound semiconductor.

Further, the light emitting semiconductor chip in the light emitting device of the present invention is preferably a semiconductor laser chip.

Further, the third dielectric film in the light emitting device of the present invention is preferably formed of an oxide, and the third dielectric film is preferably formed of at least one type of oxide selected from the group consisting of aluminum, silicon, hafnium, tantalum, zirconium, niobium, titanium, and yttrium.

Further, the third dielectric film in the light emitting device of the present invention is preferably formed of a fluoride, and the third dielectric film is preferably formed of at least one type of fluoride selected from the group consisting of magnesium and calcium.

Further, the present invention provides a manufacturing method of a light emitting device loaded with a light emitting semiconductor chip with a protective film formed on the light emitting portion, including a step of forming a first dielectric film formed of oxynitride aluminum contained in the protective film, a step of forming a second dielectric film formed of silicon nitride or oxynitride silicon contained in the protective film, a step of forming a third dielectric film formed of an oxide or a fluoride contained in the protective film, and a step of loading the light emitting semiconductor chip without hermetically sealing.

Furthermore, the present invention provides a manufacturing method of a light emitting device loaded with a light emitting semiconductor chip with a protective film formed on a light emitting portion, including a step of forming a first dielectric film formed of oxynitride aluminum contained in the protective film, a step of forming a second dielectric film formed of silicon nitride or oxynitride silicon contained in the protective film, a step of forming a third dielectric film formed of an oxide or a fluoride contained in the protective film, and a step of hermetically sealing the light emitting semiconductor chip together with an adhesive containing an organic substance and loading the semiconductor chip.

According to the present invention, a light emitting device that is capable of suppressing the deterioration in characteristics and improving reliability, and a manufacturing method of the light emitting device can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
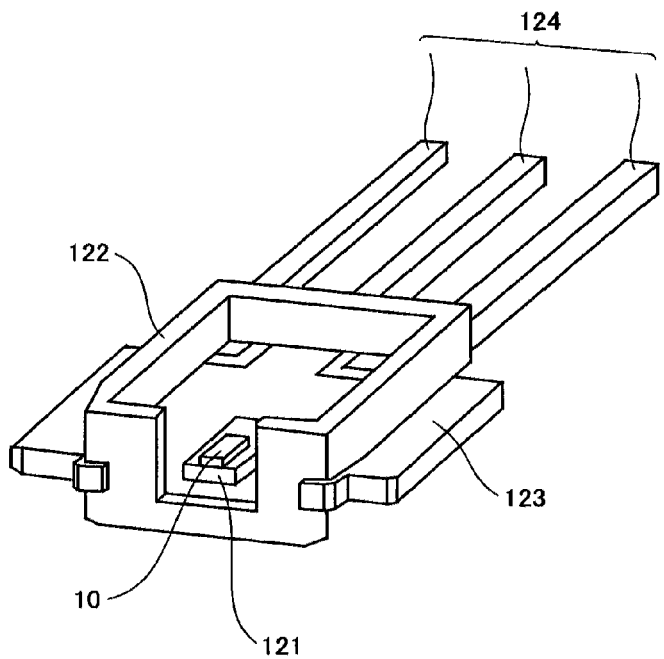
FIG. 1 is a schematic perspective view of the semiconductor laser device in Embodiment 1 of the present invention.

Embodiments of the present invention will be described in the following. In the drawings of the present invention, the same reference numbers represent the same parts or the corresponding parts.

The present inventors focused on a protective film formed on the light emitting portion of the light emitting semiconductor chip in order to solve the above-described problems. The conventional countermeasure to formation of the deposition is as in Japanese Patent Laying-Open No. 2004-289010 and Japanese Patent Laying-Open No. 2004-040051, and an investigation related to the protective film formed on the light emitting portion has almost not been performed.

Specifically, the present inventors formed a protective film with various configurations using various materials on the cavity edge containing the light emitting portion of a semiconductor laser chip (formed using a nitride III-V group compound semiconductor) of which the emitting light wavelength (wavelength of the light that is emitted) is 400 nm to 410 nm, and performed a continuous driving test on the loaded semiconductor laser device.

Here, the loading of the semiconductor laser chip was performed by adhering the semiconductor laser chip after formation of the protective film to a sub-mount with solder, and adhering the sub-mount to which the semiconductor laser chip was adhered to a base with solder. Further, the continuous driving test was performed without hermetically sealing the semiconductor laser chip with a package (sealing with a package so that gas outside of the package does not enter inside of the package).

Figure 8:
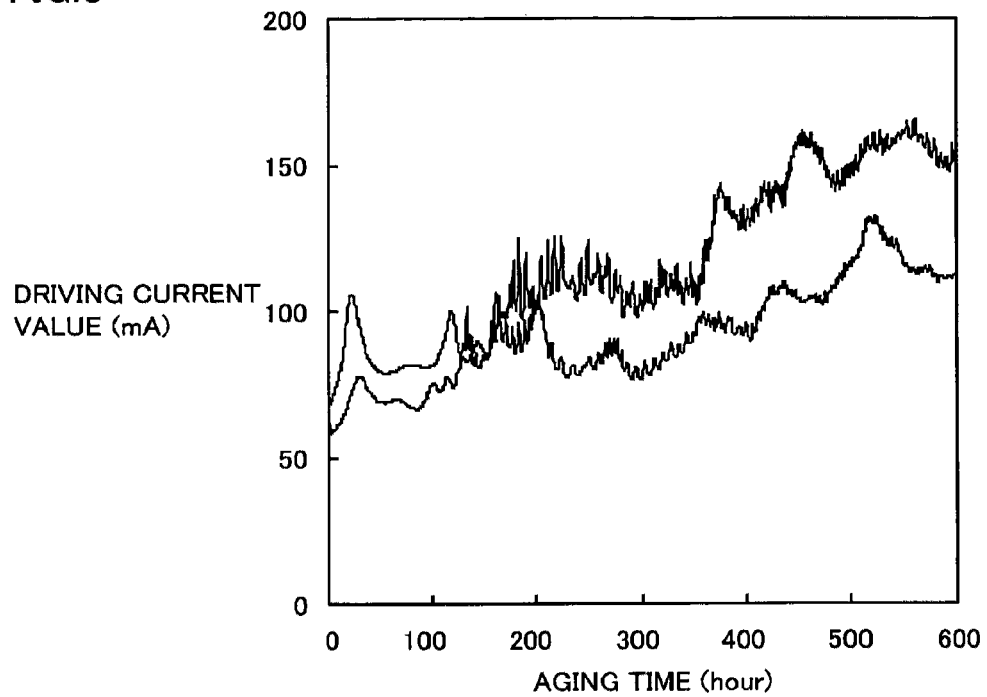
FIG. 8 is a drawing showing the relationship of the aging time with the driving current value when a continuous driving test is performed on a semiconductor laser device loaded with the semiconductor laser chip of Conventional Example 1.

First, the continuous driving test of a semiconductor laser device loaded with a semiconductor laser chip (Conventional Example 1) in which a protective film formed of aluminum oxide ($Al_2O_3$) is formed on the cavity edge was performed. The result is shown in FIG. 8. Here, the continuous driving test was performed with a mode to control the driving current value so that the light output becomes constant at 15 mW at a temperature of 75° C. (APC mode) using an apparatus exclusive for the continuous driving test of the semiconductor laser device.

As shown in FIG. 8, the driving current value was changed largely in the continuous driving test of the semiconductor laser device loaded with the semiconductor laser chip of Conventional Example 1. This is the same result as the result shown in Japanese Patent Laying-Open No. 2004-289010 and Japanese Patent Laying-Open 2004-040051.

Next, a semiconductor laser chip (Conventional Example 2) was produced in which a protective film formed of an oxynitride aluminum film directly contacting to the cavity edge and an aluminum oxide film formed right above it on the cavity edge. In this semiconductor laser chip of Conventional Example 2, a higher COD (Catastrophic Optical Damage) level than that in Conventional Example 1 was obtained in the evaluation performed before the continuous driving test. Therefore, it can be said that the output characteristic of the semiconductor laser chip of Conventional Example 2 was improved as compared with the semiconductor laser chip of Conventional Example 1. It is considered that it is because oxidation of the interface of the semiconductor and the oxynitride aluminum film was suppressed more as compared with Conventional Example 1, the level of non-radiative recombination decreased, and therefore light absorption decreased, by forming the oxynitride aluminum film to be in contact with the semiconductor forming the cavity edge. Further, because the oxynitride aluminum film has excellent heat conductivity, it is considered that an ability of effectively setting free the heat generated at the light emitting portion is one cause of the improvement in the high output characteristic. Furthermore, oxygen in the oxynitride aluminum film is considered to be useful in improving adhesiveness of the semiconductor with the oxynitride aluminum film and adhesiveness of the oxynitride aluminum film with the aluminum oxide film right above it.

Figure 9:
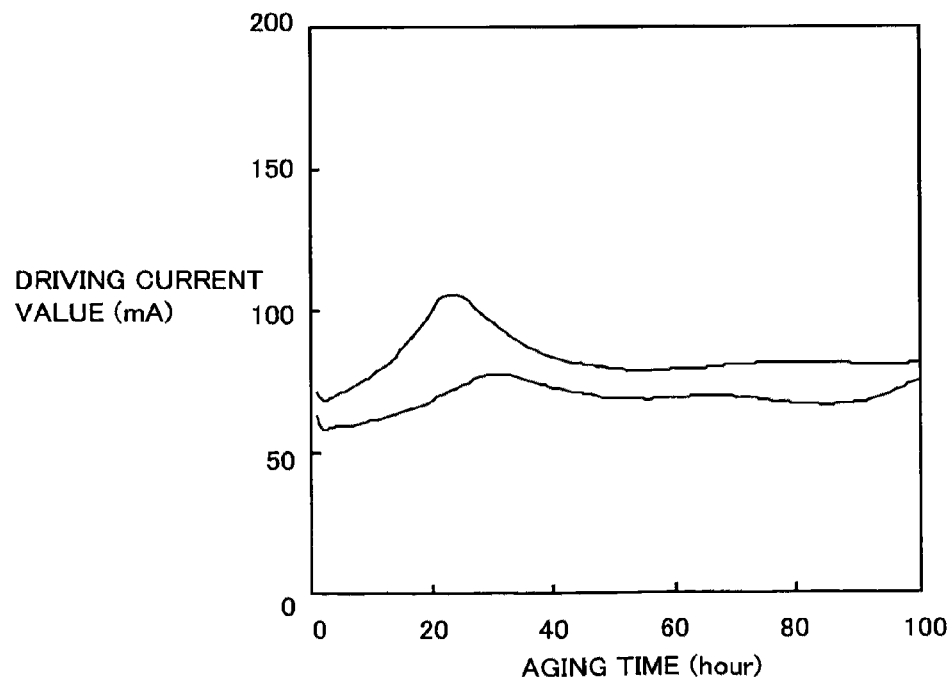
FIG. 9 is a drawing showing the relationship of the aging time with the driving current value when a continuous driving test is performed on a semiconductor laser device loaded with the semiconductor laser chip of Conventional Example 2 in the same manner as in Conventional Example 1.

Next, the continuous driving test of the semiconductor laser device loaded with the semiconductor laser chip of Conventional Example 2 in the same manner as in Conventional Example 1 was performed. The result is shown in FIG. 9. Here, the continuous driving test was performed in the same manner as in Conventional Example 1 using an apparatus exclusive for the continuous driving test of the semiconductor laser device in a mode of controlling the driving current value so that the light output at a temperature of 75° C. becomes constant at 15 mW (APC mode).

However, as shown in FIG. 9, because a large change in the driving current value can be seen also in the semiconductor laser device loaded with the semiconductor laser chip of Conventional Example 2 in the same manner as in the semiconductor laser device loaded with the semiconductor laser chip of Conventional Example 1, it can be said that driving the semiconductor laser chip more stably with a higher output, and simply suppressing the deterioration in characteristics of the light emitting device and improving reliability, that is an object of the present invention, are completely separate issues.

Further, the continuous driving test was performed in the same manner as in Conventional Example 2 on a semiconductor laser device loaded with a semiconductor laser chip having a emitting light wavelength of 437 nm and a configuration in which a protective film formed of an oxynitride aluminum film directly contacting to the cavity edge and an aluminum oxide ($Al_2O_3$) film formed right above it in the same manner as in Conventional Example 2. The result is shown in FIG. 10.

Figure 10:
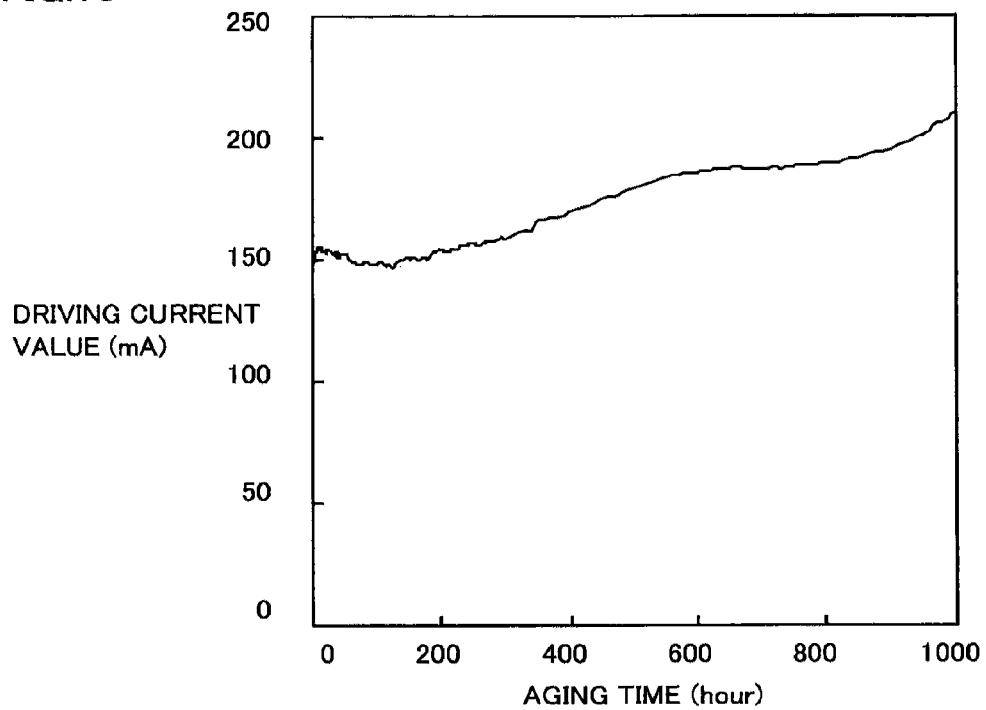
FIG. 10 is a drawing showing the relationship of the aging time with the driving current value when a continuous driving test is performed on a semiconductor laser device loaded with the semiconductor laser chip having an emitting light wavelength of 437 nm and a configuration in which the protective film is formed of an oxynitride aluminum film directly contacting to the cavity edge and an aluminum oxide film right above it, in the same manner as in Conventional Example 2.

As shown in FIG. 10, because a large change in the driving current value can be seen also in this semiconductor laser device in the same manner as in Conventional Example 2, it is understood that the change in the driving current value that is considered to be caused by formation of the deposition occurs also in a wavelength band longer than the emitting light wavelength of 405 nm.

Furthermore, a semiconductor laser chip (Conventional Example 3) was produced in which a protective film formed of an oxynitride aluminum film directly contacting to the cavity edge and a silicon nitride film formed right above it is formed on the cavity edge, and the continuous driving test was performed in the same manner as described above on the semiconductor laser device loaded with the semiconductor laser chip of Conventional Example 3 in the same manner as in Conventional Examples 1 and 2. The result is shown in FIG. 11.

Figure 11:
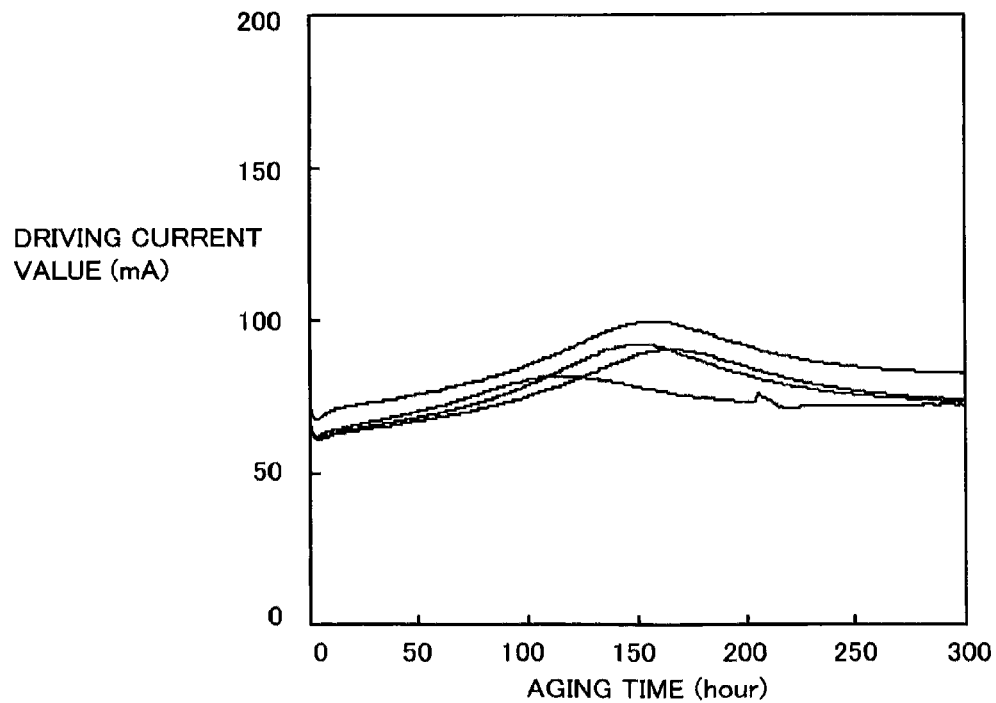
FIG. 11 is a drawing showing the relationship of the aging time with the driving current value when a continuous driving test is performed on a semiconductor laser device loaded with the semiconductor laser chip of Conventional Example 3.

A periodic change in the driving current value was seen in the same manner as in Conventional Examples 1 and 2 on the semiconductor laser device loaded with the semiconductor laser chip of Conventional Example 3 as shown in FIG. 11. However, when a detailed investigation was performed, it was found that the state was different from the case of forming other protective films as described above.

First, according to Japanese Patent Laying-Open No. 2004-289010, a disorder in a far field pattern (FFP) of a semiconductor laser device is considered to occur due to formation of the deposition. Also in the experiment by the present inventors, an FFP disorder that was not seen before the continuous driving test was observed, in the same manner as in Japanese Patent Laying-Open No. 2004-289010 in Conventional Examples 1 and 2. However, it was found that there was no change in the FFP before and after the continuous driving test in the semiconductor laser device loaded with the semiconductor laser chip of Conventional Example 3. The present inventors further performed a detailed investigation by paying attention to this point.

Figure 12:
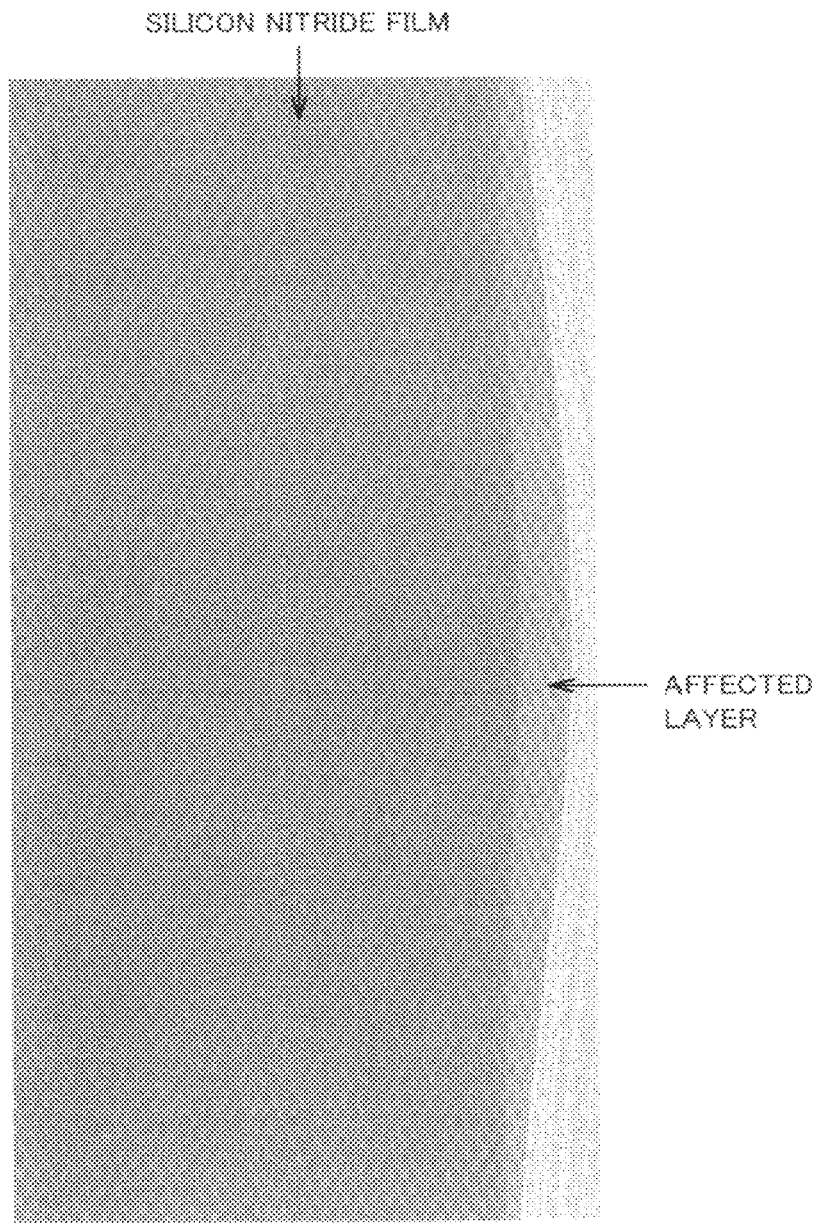
FIG. 12 is a drawing showing an observation result with a transmission electron microscope near the surface of the silicon nitride film of the semiconductor laser chip of Conventional Example 3 after the continuous driving test.

The observation result near the surface of the silicon nitride film of the semiconductor laser chip of Conventional Example 3 after the continuous driving test by a transmission electron microscope (TEM) is shown in FIG. 12. As shown in FIG. 12, an affected layer is formed on the surface of the silicon nitride film of the semiconductor laser chip of Conventional Example 3. Silicon (Si) and oxygen (0) were detected as a result of performing an elemental analysis on this affected layer with an energy dispersive x-ray spectroscopy (EDX). It is same as formation of the deposition that is conventionally seen in this point.

However, it was found that an affected layer maintaining a relatively neat layer form was formed unlike the state in which the deposition is attached on the protective film in disorder as in the TEM observation result reported in Japanese Patent Laying-Open No. 2004-289010. Because of that, it is considered that a disorder does not occur in the FFP in the semiconductor laser chip of Conventional Example 3 even after the continuous driving test. Further, according to the TEM observation result, it is considered that a substitution of nitrogen (N) and oxygen (O) occurred on the surface of the silicon nitride film and not a deposition but such an affected layer was formed, as one possibility.

From the result as described above, it can be considered that a different phenomenon from the phenomenon reported before is occurring in the semiconductor laser device loaded with the semiconductor laser chip of Conventional Example 3. However, it is true that the change in the driving current value occurs in the semiconductor laser device loaded with the semiconductor laser chip of Conventional Example 3, and the object of the present invention cannot be achieved unless this point is improved.

The present inventors considered that a cause of which the driving current value changes in Conventional Example 3 is in the affected layer on the silicon nitride film seen in the TEM observation result. It is not known whether the affected layer is due to formation of the deposition or substitution of nitrogen with oxygen. However, the indexes of refraction of silicon nitride and silicon oxide (SiOx) are different. Because of that, reflectance sensed by light become different as the affected layer is formed in any of the cases. In the case that the reflectance is different, the characteristics of a semiconductor laser device change, and especially, it is considered that the phenomenon in which the driving current value sometimes decreases as seen in FIGS. 8 to 11 is caused by the change in the reflectance. It can be verified if the reflectance of the silicon nitride film on the light emitting portion can be measured. However, the diameter of the light emitting portion of the semiconductor laser chip is generally only about 2 μm, and it is considered to be extremely difficult to measure the reflectance of only the diameter region of about 2 μm of the silicon nitride film.

Accordingly, the present inventors continued to investigate whether there is a method in which the affected layer is not formed on the surface of the silicon nitride film.

First, a surface treatment method was investigated in which it becomes difficult for nitrogen to leave the surface of the silicon nitride film that becomes the top surface. This is because of consideration by the inventors that the substitution of nitrogen with oxygen will not occur if nitrogen does not leave from the silicon nitride film. Because of that, irradiation of nitrogen plasma which is not normally performed was performed after the silicon nitride film was formed. The purpose of this is to solve a shortage of nitrogen on the surface of the silicon nitride film.

However, when the continuous driving test of the semiconductor laser device loaded with a semiconductor laser chip in which the nitrogen plasma was irradiated without hermetically sealing was performed, the result was the same as in the semiconductor laser device loaded with the semiconductor laser chip of Conventional Example 3, and no effect was obtained.

Next, a semiconductor laser chip was formed in which the oxynitride aluminum film directly contacting to the semiconductor was formed, a silicon nitride film was formed right above it, and a protective layer equipped with an aluminum oxide ($Al_2O_3$) film was formed on the surface of the silicon nitride film. Then, the continuous driving test was performed in the same manner as in Conventional Examples 1 to 3 on the semiconductor laser device loaded with this semiconductor laser chip in the same manner as in Conventional Examples 1 to 3. The result is shown in FIG. 13.

Figure 13:
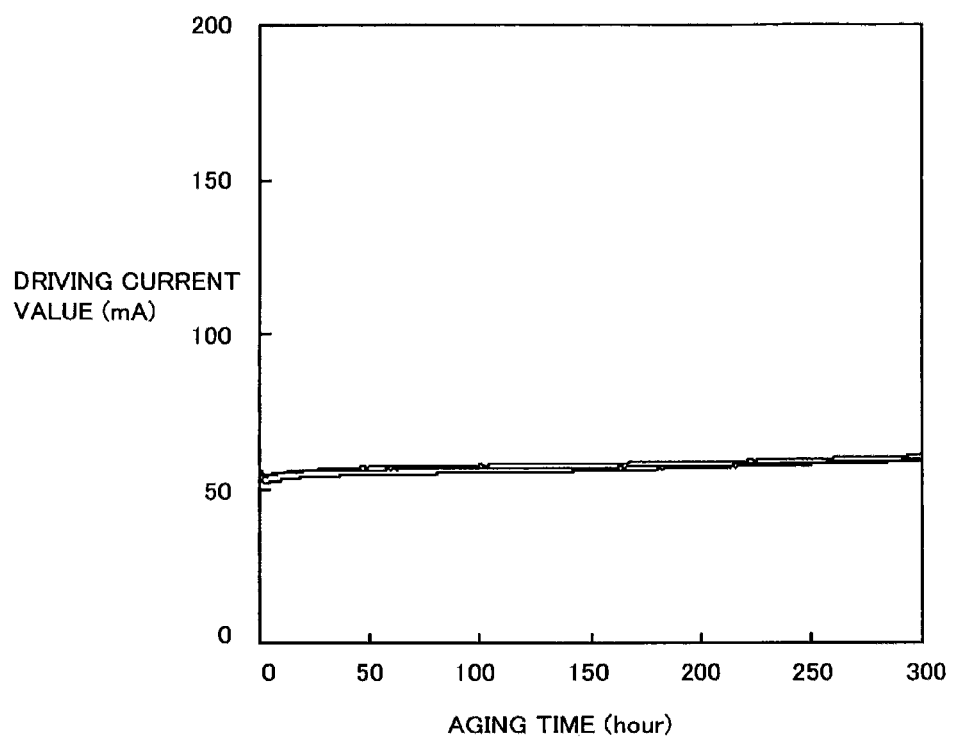
FIG. 13 is a drawing showing the relationship of the aging time with the driving current value when a continuous driving test is performed on a semiconductor laser device loaded with a semiconductor laser chip in which a protective film equipped with an oxynitride aluminum film, a silicon nitride film, and an aluminum oxide film from the semiconductor side is formed.
Figure 14:
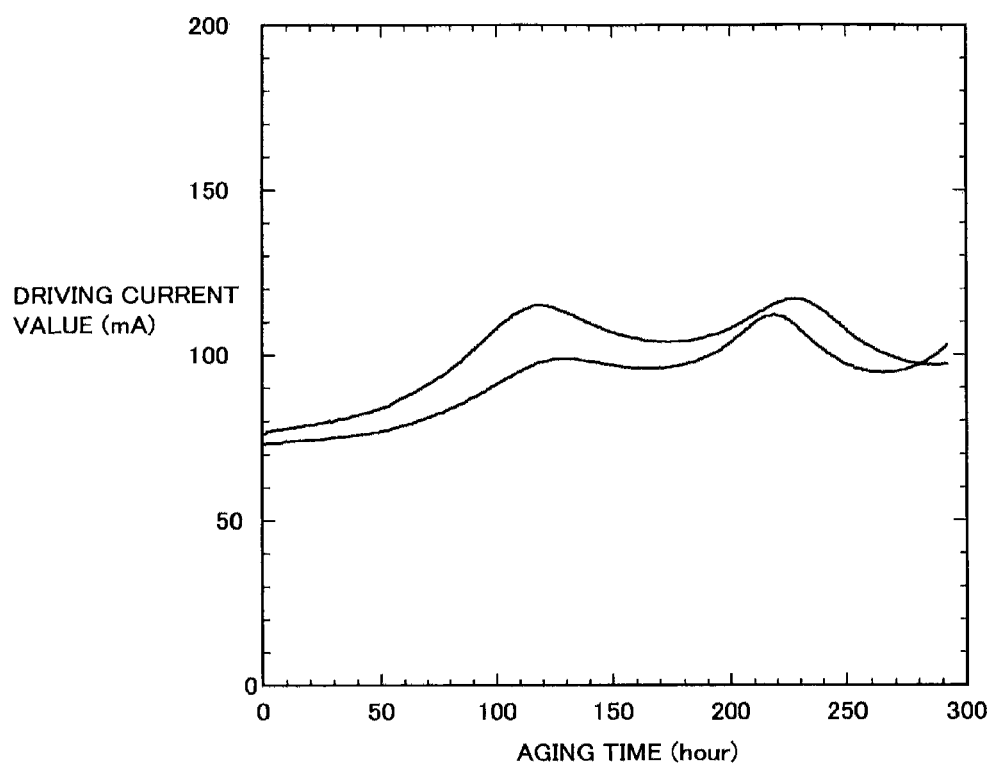
FIG. 14 is a result of a continuous driving test performed on a semiconductor laser device in which a semiconductor laser chip having an emitting light wavelength of about 405 nm is hermetically sealed with an adhesive containing an organic substance in a package.

As shown in FIG. 13, a large change in the driving current value seen in Conventional Examples 1 to 3 cannot be seen in this semiconductor laser device, and the same result is obtained as the semiconductor laser device loaded with the semiconductor laser chip by hermetically sealing it in a package in order to prevent impurities from outside from mixing into it.

Further, the surface of the protective film was observed with an optical microscope after continuously driving this semiconductor laser device for 300 hours. However, existence of the affected layer could not be confirmed. It has been said that a silicon nitride film is a nitride film having high moisture resistance and oxidation resistance in general. However, why a structure of the protective film formed of an oxynitride aluminum film, a silicon nitride film, and an aluminum oxide film has an effect in formation of the deposition that has been conventionally considered to be a problem is not understood at this time. Perhaps, it is supposed that some factor other than light having a short wavelength and a substance that is contained in an atmosphere and becoming an origin of the deposition influences on formation of the deposition, and that the silicon nitride film has some effect of eliminating the factor.

In addition, the aluminum oxide film on the silicon nitride film is considered to have an effect on formation of the affected layer formed of silicon and oxygen generated in the case of not hermetically sealing the film even if it is a silicon nitride film that is considered to have high oxidization resistance in general. It is supposed that this is because an aluminum oxide film having strong oxidation resistance prevents the oxidation from occurring even in the silicon nitride film that is said to have high oxidation resistance among nitride films under an extremely high light density as a semiconductor laser device. Further, various oxide films or fluoride films are considered to be usable besides the aluminum oxide film as a material having high oxidation resistance. Furthermore, the same effect as the silicon nitride film is considered to be realized for the oxynitride silicon film. The present inventors have finally conceived the present invention from the above experimental results.

Embodiment 1

A schematic perspective view of one example of the semiconductor laser device that is one example of the light emitting device of the present invention is shown in FIG. 1. The semiconductor laser device shown in FIG. 1 has a configuration in which a semiconductor laser chip 10 is loaded in a form in which the hermetic sealing with a package called as a frame package is not performed. Here, semiconductor laser chip 10 is provided on a sub-mount 121, and sub mount 121 is provided on a radiation fin 123 equipped with a lead pin 124. Further, a frame package 122 that is resin-molded is formed on radiation fin 123 around semiconductor laser chip 10 so as to surround a part other than the part where the emitted light from semiconductor laser chip 10 is taken outside.

Figure 2:
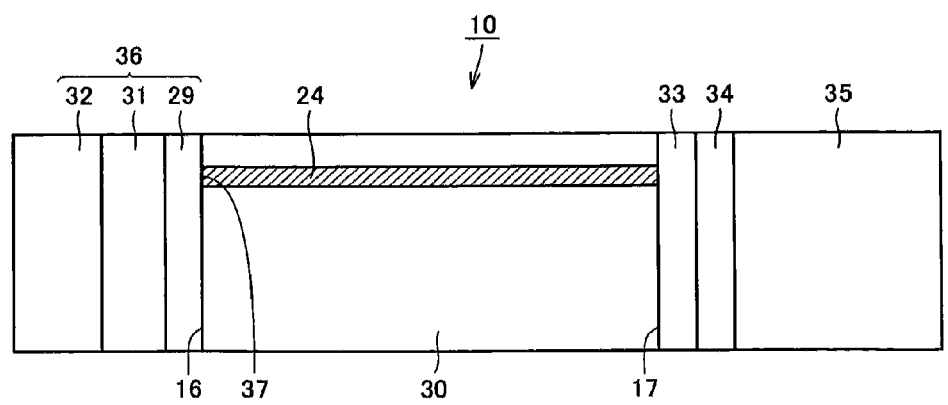
FIG. 2 is a drawing schematically showing a configuration along the resonator lengthwise direction of one example of the semiconductor laser chip shown in FIG. 1.

A configuration along a resonator lengthwise direction of one example of semiconductor laser chip 10 shown in FIG. 1 is schematically shown in FIG. 2. Here, semiconductor laser chip 10 has a nitride semiconductor layered structure 30 including a structure of a nitride semiconductor crystal layer formed of a nitride III-V group compound semiconductor layered on a substrate, nitride semiconductor layered structure 30 has an active layer 24 having a multiplex quantum well structure formed of the nitride III-V group compound semiconductor, and a light emitting portion 37 emitting light is located on the cavity edge in the light emitting side of active layer 24.

A protective layer 36 is formed on cavity edge 16 in the light emitting side of nitride semiconductor layered structure 30 by layering a first dielectric film 29 formed of an oxynitride aluminum film contacting to cavity edge 16, a second dielectric film 31 formed of a silicon nitride film, and a third dielectric film 32 formed of an aluminum oxide film in series.

An oxynitride aluminum film 33 is formed on cavity edge 17 in the light reflection side of nitride semiconductor layered structure 30 contacting to cavity edge 17, an aluminum oxide film 34 is formed right above it, and a high reflection film 35 in which six pairs of a silicon nitride film and silicon oxide film pair are formed is formed on it. Moreover, a film configuration on cavity edge 17 in the light reflection side may be the same configuration as the film configuration in the light emitting side.

The reflectance of the light emitted from active layer 24 with these films on cavity edge 17 in the light reflection side of nitride semiconductor layered structure 30 is set to be 95%.

Here, the thickness of first dielectric film 29 is preferably 3 nm or more, and more preferably 6 nm or more. In the case that the thickness of first dielectric film 29 is 3 nm or more, and especially in the case that it is 6 nm or more, a good and high output characteristic tends to be obtained even when semiconductor laser chip 10 is loaded without hermetically sealing.

Further, the thickness of first dielectric film 29 is preferably 500 nm or less, and more preferably 300 nm or less. In the case that the thickness of first dielectric film 29 is 500 nm or less, and especially in the case that it is 300 nm or less, first dielectric film 29 is uniformly formed, and a semiconductor laser device with a good and high output characteristic tends to be obtained with good yield even when semiconductor laser chip 10 is loaded without hermetically sealing.

Moreover, the thickness of first dielectric film 29 is set to 20 nm in the present embodiment.

Further, the thickness of second dielectric film 31 is preferably 20 nm or more, and more preferably 50 nm or more. In the case that the thickness of second dielectric film 31 is 20 nm or more, and especially in the case that it is 50 nm or more, the effect of suppressing the deterioration in characteristics of the semiconductor laser device tends to become large.

Further, the thickness of second dielectric film 31 is preferably 1000 nm or less, and more preferably 500 nm or less.

In the case that the thickness of second dielectric film 31 is 1000 nm or less, and especially in the case that it is 500 nm or less, second dielectric film 31 is uniformly formed, and the tendency of being able to obtain semiconductor laser chip 10 having desired characteristics with good yield becomes stronger.

Further, second dielectric film 31 is formed from the silicon nitride film in the present embodiment. However, second dielectric film 31 may be formed from the oxynitride silicon film in the present invention.

Here, in the case that second dielectric film 31 is formed from the oxynitride silicon film, the ratio (%) of the number of nitrogen atoms to the total number of silicon atoms, oxygen atoms, and nitrogen atoms in the oxynitride silicon film is preferably 5% or more, and more preferably 20% or more. In the case that the ratio (%) of the number of nitrogen atoms to the total number of silicon atoms, oxygen atoms, and nitrogen atoms in the second dielectric film 31 formed from the oxynitride silicon film is 5% or more, and especially in the case that it is 20% or more, the effect of suppressing the deterioration in characteristics of the light emitting device tends to become large.

Moreover, the thickness of second dielectric film 31 is set to 300 nm in the present embodiment.

Further, the thickness of third dielectric film 32 is preferably 5 nm or more, and more preferably 10 nm or more. In the case that the thickness of third dielectric film 32 is 5 nm or more, and especially in the case that it is 10 nm or more, the effect of suppressing the deterioration in characteristics of the semiconductor laser device tends to become large.

Further, the thickness of third dielectric film 32 is preferably 1000 nm or less, and more preferably 500 nm or less. In the case that the thickness of third dielectric film 32 is 1000 nm or less, and especially in the case that it is 500 nm or less, third dielectric film 32 is uniformly formed, and the tendency of being able to obtain semiconductor laser chip 10 having desired characteristics with good yield becomes stronger.

Further, third dielectric film 32 is formed from the aluminum oxide film in the present embodiment. However, third dielectric film 32 is preferably formed of at least one type of metal oxide selected from the group consisting of aluminum, silicon, hafnium, tantalum, zirconium, niobium, titanium, and yttrium in the present invention. Because these metal oxides are transparent to light with a short wavelength with a wavelength of 550 nm or less in the case that third dielectric film 32 is formed of the above-described metal oxides, a decrease in the semiconductor laser device characteristics due to the absorption of the emitted light or the like by third dielectric film 32 tends to be suppressed.

Here, examples of the preferred form of third dielectric film 32 formed of oxides include forms such as a single layer of a film formed of an oxide of one type of the above-described metal, a plurality of layers in which a plurality of films formed of these metal oxides are layered, a single layer of a film formed of an oxide containing two types or more of the above-described metals, a plurality of layers in which a plurality of films formed of an oxide containing two types or more of the above-described metals are layered, and a plurality of layers formed of a film formed of an oxide of one type of the above-described metal and a film formed of an oxide containing two types or more of the above-described metals.

Further, third dielectric film 32 is preferably formed of at least one type of fluoride selected from the group consisting of magnesium and calcium. In the case that third dielectric film 32 is formed of a fluoride of these metals, because these fluorides are transparent to light with a short wavelength with a wavelength of 550 nm or less, a decrease in the light emitting device characteristics due to the absorption of the emitted light or the like by third dielectric film 32 tends to be suppressed.

Here, examples of the preferred form of third dielectric film 32 formed of fluorides include a single layer of a film formed of a fluoride of either of magnesium or calcium, a single layer of a fluoride containing both magnesium and calcium, and a plurality of layers formed of a film formed of a fluoride of magnesium and a film formed of a fluoride of calcium.

Furthermore, each of the oxide and the fluoride used in the configuration of third dielectric film 32 may contain a small amount of argon, nitrogen, or the like. However, in order to secure the oxidation resistance of third dielectric film 32, the oxygen amount in third dielectric film 32 is preferably 50 atomic % or more to the total elements constituting third dielectric film 32.

Moreover, the thickness of third dielectric film 32 is set to 150 nm in the present embodiment.

Further, another dielectric film may be formed between first dielectric film 29 and second dielectric film 31 and/or between second dielectric film 31 and third dielectric film 32 in the present invention. In this case, another dielectric film may be configured from one type of film or may be configured from a laminate of a plurality of dielectric films.

Figure 3:
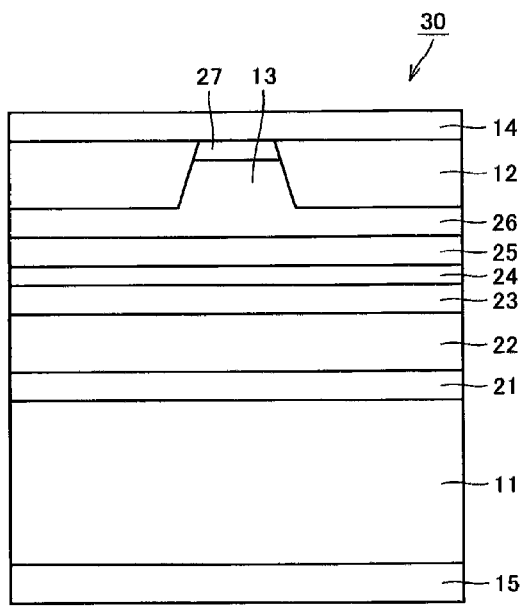
FIG. 3 is a drawing schematically showing a cross-section along a direction orthogonal to the resonator lengthwise direction of one example of the nitride semiconductor layered structure shown in FIG. 2.

FIG. 3 is a drawing schematically showing a cross-section along the direction orthogonal to the resonator lengthwise direction of one example of nitride semiconductor layered structure 30 shown in FIG. 2.

Here, nitride semiconductor layered structure 30 has a configuration in which an n-type buffer layer 21 formed of n-type GaN of 0.2 μm thickness, an n-type clad layer 22 formed of n-type $Al_{0.06}Ga_{0.94}N$ of 2.3 μm thickness, an n-type guide layer 23 formed of n-type GaN of 0.02 μm thickness, active layer 24 having a multiplex quantum well structure formed of a multiplex quantum well layer formed of InGaN of 4 nm thickness and GaN of 8 nm thickness and a protective layer formed of GaN of 70 nm thickness, a p-type current block layer 25 formed of p-type $Al_{0.3}Ga_{0.7}N$ of 20 nm thickness, a p-type clad layer 26 formed of p-type $Al_{0.05}Ga_{0.95}N$ of 0.5 μm thickness, and a p-type contact layer 27 formed of p-type GaN of 0.1 μm thickness are layered on an n-type GaN substrate 11 by being epitaxially-grown in this order from n-type GaN substrate 11 side.

Moreover, the mixed crystal ratio of each of the above-described layers is appropriately adjusted, and does not relate to the essence of the present invention. Further, the wavelength of the laser light oscillated from the semiconductor laser chip can be adjusted appropriately in the range of 370 nm to 470 nm for example depending on the mixed crystal ratio of active layer 24. In the present embodiment, the wavelength is adjusted so that laser light with a wavelength of 405 nm is oscillated.

Further, in nitride semiconductor layered structure 30, a part of p-type clad layer 26 and p-type contact layer 27 is removed, and a striped ridge stripe part 13 is formed so as to extend to the resonator lengthwise direction. Here, a width of the stripe in ridge stripe part 13 is about 1.2 to 2.4 μm for example, and typically about 1.5 μm.

Further, a p electrode 14 is provided on the surface of p-type contact layer 27, and an insulation film 12 is provided on the lower part of p electrode 14 excluding ridge stripe part 13. Further, an n electrode 15 is formed on the surface of the opposite side from the layered side of the above-described layers of n-type GaN substrate 11.

Further, a nitride III-V group compound semiconductor layer can be appropriately used other than the above for each nitride semiconductor layer configuring nitride semiconductor layered structure 30. An example of the nitride III-V group compound semiconductor layer is a layer formed of a compound of at least one type of group III elements selected from the group consisting of aluminum, indium, and gallium with nitrogen that is a group V element represented by a formula: $Al_xIn_yGa_zN$ ($0 \leq x \leq 1$, $0 \leq y \leq 1$, $0 \leq z \leq 1$, $x+y+z \neq 0$). Moreover, the nitride III-V group compound semiconductor layer may be appropriately doped with an n-type dopant or a p-type dopant.

Semiconductor laser chip 10 having the configuration shown in FIG. 2 can be formed as follows, for example. First, a ridge stripe part is formed by layering each of the nitride semiconductor layers shown in FIG. 3 such as n-type buffer layer 21 in series on n-type GaN substrate 11 shown in FIG. 3, and then a laser bar is formed by cleaving a wafer in which each of an insulation film, the p electrode and the n electrode is formed with a scribe and break method by a diamond point. The cleaved faces by this cleaving become cavity edge 16 in the light emitting side and cavity edge 17 in the light reflection side that are parallel to each other as shown in FIG. 2.

Next, first dielectric film 29, second dielectric film 31, third dielectric film 32, oxynitride aluminum film 33, aluminum oxide film 34, and high reflection film 35 shown in FIG. 2 are formed. Each of these films can be formed by an ECR (Electron Cyclotron Resonance) sputtering method, various sputtering methods other than the ECR sputtering method, a CVD (Chemical Vapor Deposition) method, an MBE (Molecular Beam Epitaxy) method, or a vapor deposition method.

Figure 4:
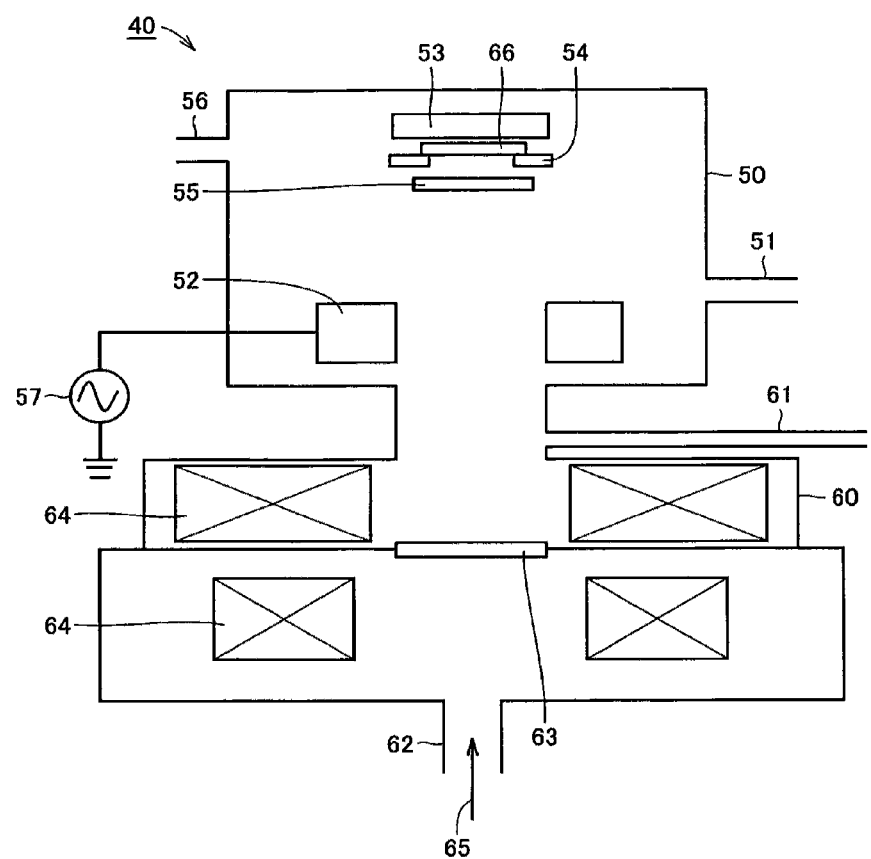
FIG. 4 is a schematic configuration drawing of an ECR sputtering apparatus.

A schematic configuration drawing of an ECR sputtering apparatus is shown in FIG. 4. Here, an ECR sputtering apparatus 40 is configured roughly from a film forming furnace 50 and a plasma producing chamber 60. A gas introducing port 51 and a gas exhausting port 56 are provided in film forming furnace 50, and a target 52, a heater for heating 53, a sample mount 54, and a shutter 55 are provided inside film forming furnace 50. Further, a laser bar 66 formed by the above-described cleaving is provided on sample mount 54, and laser bar 66 is mounted to a holder (not shown) in a direction so that film formation can be performed on cavity edge 16 or cavity edge 17. Further, a vacuum pump (not shown) is mounted in gas exhausting port 56, and gas inside film forming furnace 50 can be exhausted therefrom. Further, an RF power source 57 is connected to target 52.

Further, a gas introducing port 61 and a microwave introducing port 62 are provided in plasma producing chamber 60, and a microwave introducing window 63 and a magnetic coil 64 are provided inside plasma producing chamber 60. Plasma is produced from gas introduced from gas introducing port 61 by introducing microwave 65 introduced from microwave introducing port 62 through microwave introducing window 63.

Using ECR sputtering apparatus 40 with such a configuration, first, first dielectric film 29 formed of an oxynitride aluminum film is formed on cavity edge 16 in the light emitting side shown in FIG. 2, and then, second dielectric film 31 formed of a silicon nitride film is formed on first dielectric film 29. Then, third dielectric film 32 formed of an aluminum oxide film is formed on second dielectric film 31.

Specifically, first, nitrogen gas is introduced at a flow rate of 5.5 sccm and oxygen gas is introduced at a flow rate of 0.5 sccm into film forming furnace 50, and argon gas is introduced at a flow rate of 20 sccm in order to generate plasma efficiently and make a film forming speed high. Next, an RF power is applied at 500 W on target 52 in order to sputter target 52 of Al, a microwave power that is necessary for the production of plasma is applied at 500 W, and first dielectric film 29 formed of an oxynitride aluminum film is formed in which the film forming rate is 1.1 Å/sec and the index of refraction of light having a wavelength of 405 nm is 2.1.

After forming first dielectric film 29 as described above, second dielectric film 31 formed of a silicon nitride film is formed on first dielectric film 29 by changing the flow rates of argon gas and nitrogen gas introduced into film forming furnace 50 to 40 sccm and 5 sccm, respectively, changing the material of target 52 to Si, and stopping the introduction of oxygen gas. Here, the RF power is set to 500 W, and the microwave power is set to 500 W.

After forming second dielectric film 31 as described above, third dielectric film 32 formed of an aluminum oxide film is formed on second dielectric film 31 by changing the flow rates of argon gas and oxygen introduced into film forming furnace 50 to 40 sccm and 5.8 sccm, respectively, changing the material of target 52 to Al, and stopping the introduction of nitrogen gas. Here, the RF power is set to 500 W, and the microwave power is set to 500 W.

Then, after formation of first dielectric film 29, second dielectric film 31, and third dielectric film 32, oxynitride aluminum film 33, aluminum oxide film 34, and high reflection film 35 are formed on cavity edge 17 in the light emitting side in this order by the ECR sputtering method, or the like.

As described above, a first protective film 29, a second protective film 31, and a third protective film 32 are formed in series on cavity edge 16 in the light emitting side of laser bar 66, oxynitride aluminum film 33, aluminum oxide film 34, and high reflection film 35 are formed in series, and then semiconductor laser chip 10 of the present embodiment can be obtained by dicing the product along the resonator lengthwise direction of laser bar 66 in a chip form.

In the semiconductor laser device shown in FIG. 1 loaded with semiconductor laser chip 10 obtained as described above, semiconductor laser chip 10 is not hermetically sealed with frame package 122. However, a semiconductor laser device with high reliability can be made because the deposition can be suppressed from forming on the surface of protective film 36 of semiconductor laser chip 10 during operation of the semiconductor laser device by forming protective film 36 formed of first dielectric film 29, second dielectric film 31, and third dielectric film 32.

Moreover, because the semiconductor laser device of the present embodiment is made to have a frame type loading in which hermetic sealing of semiconductor laser chip 10 with a package is not performed, a thinner size and a lighter weight can be achieved as compared with a can type loading, and at the same time, the assembly step can be rationalized substantially, and cost reduction can be achieved. Further, the present invention can be applied to a loading in the mode where the chip is not hermetically sealed without being limited to the frame type.

Further, the present invention can be applied to a surface emitting type semiconductor laser chip and a light emitting device loaded with a light emitting diode chip, for example, as a light emitting type semiconductor chip. In this case, protective film 36 is formed on the light emitting face that becomes the light emitting portion of each of the surface emitting type semiconductor laser chip and the light emitting diode chop at the stage when protective film 36 is not formed. However, the semiconductor laser chip is preferably used as the light emitting type semiconductor chip in the present invention. Because the light density in the light emitting portion in light emission of the semiconductor laser chip is very high, a problem of a decrease in reliability caused by the deterioration in characteristics of the light emitting device easily occurs especially in the case that the wavelength of the emitted light exists in the wavelength range of bluish purple to blue. However, generation of such a problem can be decreased in the present invention even in the case of using a semiconductor laser chip that emits light with such a wavelength.

Further, the effect of the present invention can be applied to the light emitting type semiconductor chip that emits light with a wavelength with which the formation of the deposition occurs. The wavelength band of such light is considered to be the wavelength range of about ultraviolet to green.

Embodiment 2

Figure 5:
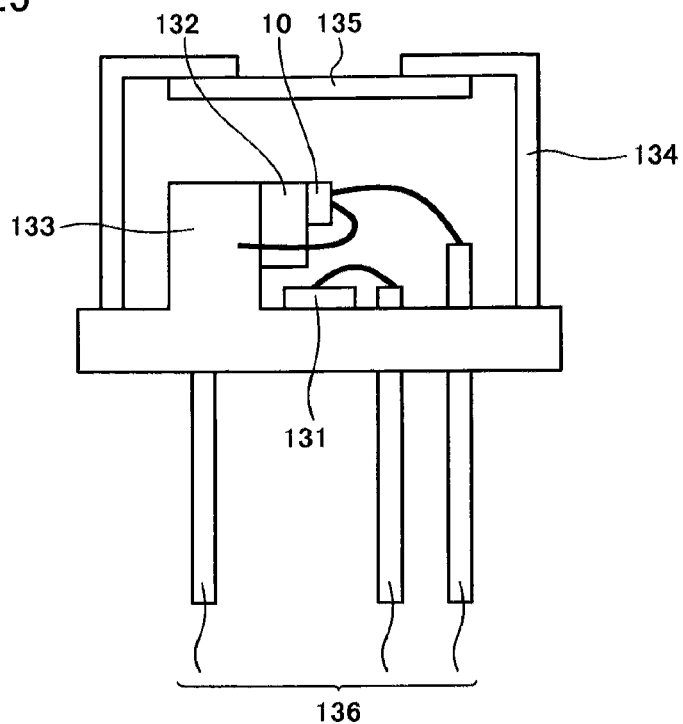
FIG. 5 is a schematic side perspective view of the semiconductor laser device in Embodiment 2 of the present invention.

A characteristic of the light emitting device of the present embodiment is that a semiconductor laser chip 10 having the same configuration as in Embodiment 1 is loaded in the can type mode. A schematic side perspective view of the semiconductor laser device as the light emitting device of Embodiment 2 is shown in FIG. 5.

Here, semiconductor laser chip 10 is provided on a sub-mount 132, and sub-mount 132 is provided on the side face of a part projecting upward of a stem 133. Further, a light-receiving element 131 is provided on the surface of a planer part of stem 133 as an optical element, and a cap 134 as a package is formed so as to surround semiconductor laser chip 10.

Further, three lead pins 136 are equipped in stem 133, and each of these lead pins 136 is connected to stem 133, semiconductor laser chip 10, and light-receiving element 131. Furthermore, an optical glass window 135 to take out light from semiconductor laser chip 10 is provided in a central part of cap 134, and semiconductor laser chip 10 is hermetically sealed in a package formed of cap 134 equipped with optical glass window 135.

Here, solder is used for the adhesion of semiconductor laser chip 10 with sub-mount 132, and an Ag paste (an adhesive formed of an organic resin containing Ag particles) is used for the adhesion of sub-mount 132 with stem 133 and the adhesion of light-receiving element 131 with stem 133. Because the Ag paste is a conductive adhesive containing an organic substance, the deposition is formed on a protective film 36 by organic compound gas generated from this Ag paste even if it is hermetically sealed in the case that protective film 36 shown in FIG. 2 is not formed in semiconductor laser chip 10, and characteristics of the semiconductor laser device are spoiled.

However, because semiconductor laser chip 10 in which protective film 36 formed of first dielectric film 29, second dielectric film 31, and third dielectric film 32 is formed on cavity edge 16 in the light emitting side as shown in FIG. 2 is loaded in the semiconductor laser device of the present embodiment, formation of the deposition during the operation of the semiconductor laser device is suppressed, and a semiconductor laser device with high reliability can be made even in the case that semiconductor laser chip 10 is hermetically sealed together with an adhesive containing an organic substance such as the Ag paste.

Further, because it is not necessary to lower the vapor pressure of the organic compound gas in the cap in the present embodiment, manufacturing of the semiconductor laser device becomes simple.

Further, the manufacturing step of the semiconductor laser device can be made simple in the present embodiment as compared with the case of adhering using only solder without using an adhesive containing an organic substance such as the Ag paste.

Further, the adhesion is performed using the Ag paste in the present embodiment. However, the present invention can be applied to the case of using an adhesive containing various organic substances such as epoxy-type and silicone-type other than the Ag paste.

Further, the present invention can be applied to a light emitting device of a type in which a semiconductor laser chip and an optical element are stored in a package such as a hologram laser device, not only to a normal can type.

Further, the adhesion may be performed in at least one part in the case of adhering using an adhesive containing an organic substance such as the Ag paste in the present invention. For example, the adhesion of the semiconductor laser chip with the sub-mount and the adhesion of the sub-mount with the stem are performed using solder, and the adhesive containing an organic substance such as an Ag paste can be used only in the adhesion of the light-receiving element with the stem or the adhesive containing an organic substance can be used in all of these adhesion parts.

Further, the hermetical sealing of the semiconductor laser chip can be performed usually in a dry air atmosphere in which the dew-point temperature is kept low in order to secure the reliability of the semiconductor laser device. However, the reliability of the semiconductor laser device can be improved even in the case that the hermetic sealing is performed in the state where the dew-point temperature is high when the present invention is applied.

Embodiment 3

Figure 6:
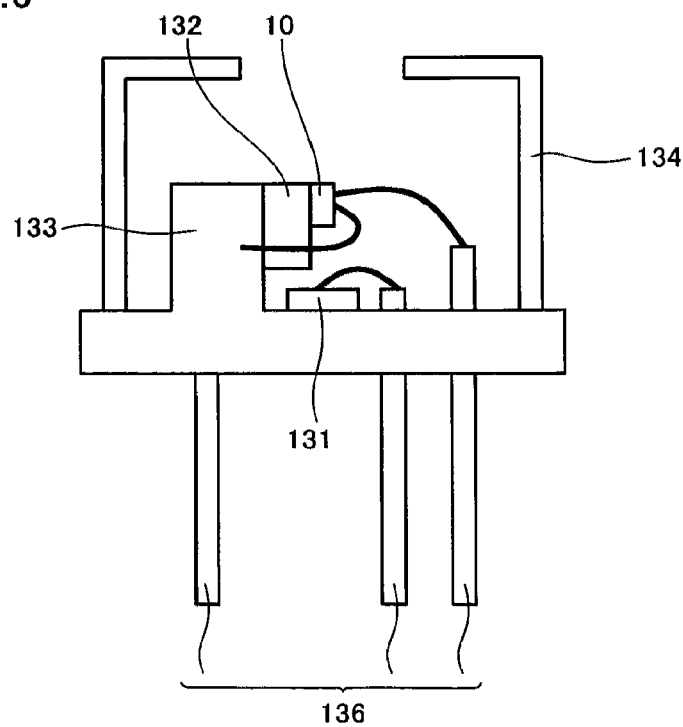
FIG. 6 is a schematic side perspective view of the semiconductor laser device in Embodiment 3 of the present invention.

The light emitting device of the present embodiment is loaded with a semiconductor laser chip 10 having the same configuration as in Embodiment 1 in the mode of the can type in the same manner as in Embodiment 2. However, different from Embodiment 2, it is characterized in that the optical glass window is not equipped, the part where the optical glass window is provided is an opening, and semiconductor laser chip 10 is not hermetically sealed. A schematic side perspective view of the semiconductor laser device as the light emitting device of Embodiment 3 is shown in FIG. 6.

As described above, in the case that protective film 36 shown in FIG. 2 is not formed in semiconductor laser chip 10, the deposition is formed on protective film 36 by the organic compound gas generated from this Ag paste even if it is hermetically sealed, and the characteristics of the semiconductor laser device are spoiled.

However, because semiconductor laser chip 10 in which protective film 36 formed of first dielectric film 29, second dielectric film 31, and third dielectric film 32 is formed on cavity edge 16 in the light emitting side as shown in FIG. 2 is loaded in the semiconductor laser device of the present embodiment, formation of the deposition during the operation of the semiconductor laser device is suppressed, and a semiconductor laser device having high reliability can be made even in the case that semiconductor laser chip 10 is hermetically sealed together with an adhesive containing an organic substance such as the Ag paste.

Furthermore, because there is no necessity of using the optical glass window in the semiconductor laser device of the present embodiment, the manufacturing cost of the light emitting device can be decreased as compared with the case where there is an optical glass window such as the conventional package.

Embodiment 4

The light emitting device of the present embodiment has a configuration in which a semiconductor laser chip 10 having the same configuration as in Embodiment 1 is loaded in the mode of the type called an HHL (High Heat Load) package. The HHL package is used in a semiconductor laser device of high output wattage class applied to illumination use and the like.

Figure 7A:
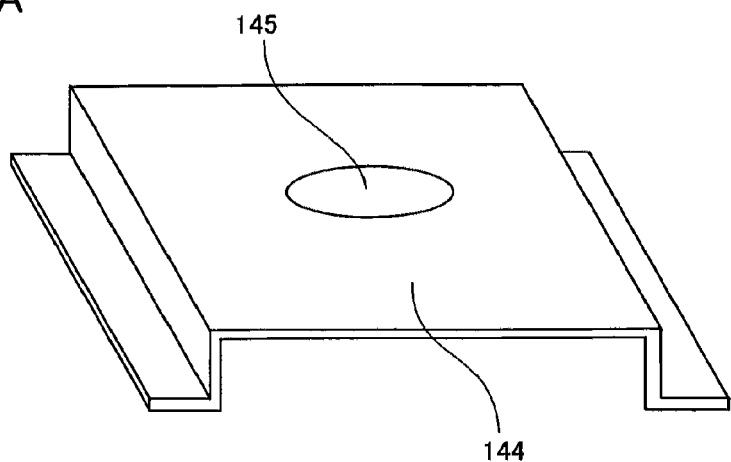
FIG. 7A is a schematic perspective view of a lid part of the semiconductor laser device in Embodiment 4.
Figure 7B:
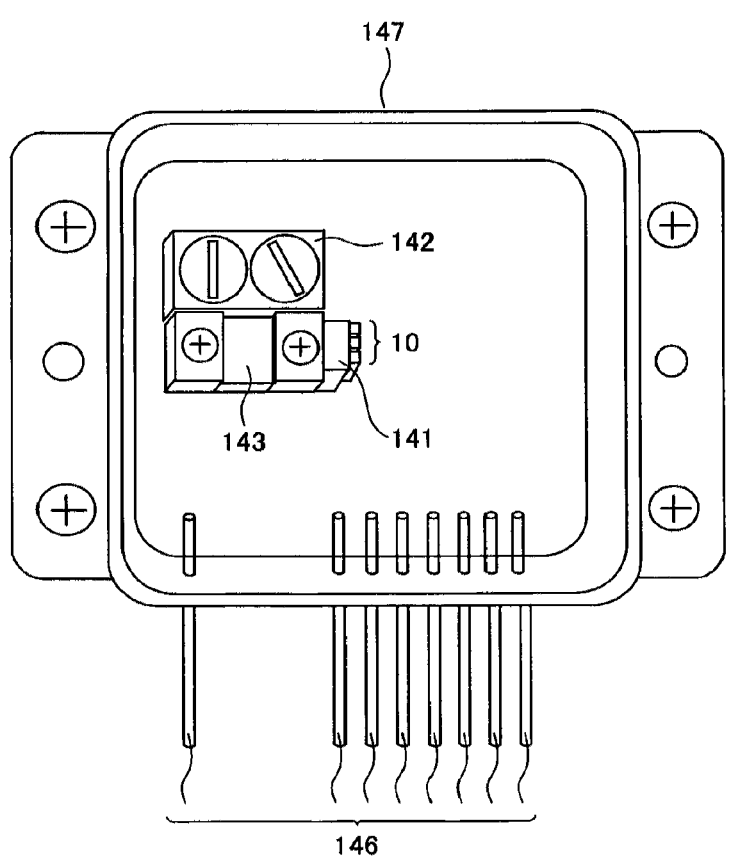
FIG. 7B is a schematic perspective view of an HHL package main body part of the semiconductor laser device in Embodiment 4.

A schematic perspective view of a lid part of the semiconductor laser device as the light emitting device of the present embodiment is shown in FIG. 7A, and a schematic perspective view of an HHL package main body part in which the semiconductor laser chip is loaded in the semiconductor laser device of the present embodiment is shown in FIG. 7B. Here, the semiconductor laser device of the present embodiment is configured by covering an opening of a box-shaped HHL package main body part 147 loaded with the semiconductor laser chip shown in FIG. 7B with a lid part 144 shown in FIG. 7A.

As shown in FIG. 7A, lid part 144 is equipped with an optical glass window 145 to take out emitted light from loaded semiconductor laser chip 10 in the center of its surface. In addition, as shown in FIG. 7B, a plurality (three in FIG. 7B) of semiconductor laser chips 10 are provided on a sub-mount 141 inside HHL package main body part 147, and sub-mount 141 is provided on a heat spreader 143. Further, a wiring board 142 is provided so as to be adjacent to heat spreader 143, a plurality of lead pins 146 are provided so as to pierce the side face of HHL package main body part 147.

Here, in HHL package main body part 147, each of semiconductor laser chip 10 and sub-mount 141, sub-mount 141 and heat spreader 143, and heat spreader 143 and HHL package main body part 147 are adhered with solder. Further, lid part 144 and HHL package main body part 147 are adhered with welding or low-temperature solder. A material that cleans the metal surface, that is called flux, is contained in the low-temperature solder, and this flux contains an oil called rosin as a main component, and made from an organic substance. Further, a copper wire used in wiring board 142 is coated with vinyl. Further, a Peltier element may be provided in HHL package main body part 147.

Because the number of the configuration parts is large such that a plurality of semiconductor laser chips 10 are provided and the adhesion parts become diverse in the case that semiconductor laser chip 10 is loaded in the mode of an HHL package as the semiconductor laser device of the present embodiment, the use amount of the organic substance is considered to become greater. Further, the adhesion of lid part 144 and HHL package main body part 147 is difficult as compared with the can type, and it becomes difficult to keep air-tightness.

However, because semiconductor laser chip 10 in which protective film 36 formed of first dielectric film 29, second dielectric film 31, and third dielectric film 32 are formed on cavity edge 16 in the light emitting side as shown in FIG. 2 is loaded in the semiconductor laser device of the present embodiment, formation of the deposition during the operation of the semiconductor laser device is suppressed, and a semiconductor laser device with high reliability can be made.

Needless to say, the present invention can be applied to the case of loading a light emitting type semiconductor chip in various modes of packages without being limited to the HHL package.

According to the present invention, because the light emitting device that is capable of suppressing the deterioration in characteristics and improving reliability can be obtained, the light emitting device of the present invention can be preferably used in electronic information equipment, illumination apparatuses, and the like.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A light emitting device comprising:
a light emitting semiconductor chip including an active layer, a light emitting portion, and a protective film, said active layer formed of a nitride III-V group compound semiconductor, said light emitting portion including said nitride III-V group compound semiconductor, said protective film formed on said light emitting portion, wherein said light emitting semiconductor chip is not hermetically sealed, said protective film contains a first dielectric film formed of aluminum oxynitride, a second dielectric film formed of silicon nitride or silicon oxynitride, and a third dielectric film formed of an oxide or a fluoride, said first dielectric film is located more toward said light emitting portion than said second dielectric film, said second dielectric film is located more toward said light emitting portion than said third dielectric film, said light emitting semiconductor chip contains a nitride III-V group compound semiconductor, and said light emitting semiconductor chip is a semiconductor laser chip.

2. The light emitting device according to claim 1, wherein said light emitting semiconductor chip is loaded in a state of a frame package.

3. The light emitting device according to claim 1, wherein said third dielectric film is formed of an oxide, and said third dielectric film is formed of at least one type of oxide selected from the group consisting of aluminum, silicon, hafnium, tantalum, zirconium, niobium, titanium, and yttrium.

4. The light emitting device according to claim 1, wherein said third dielectric film is formed of a fluoride, and said third dielectric film is formed of at least one type of fluoride selected from the group consisting of magnesium and calcium.

5. A light emitting device comprising:
a light emitting semiconductor chip including an active layer, a light emitting portion, and a protective film, said active layer formed of a nitride III-V group compound semiconductor, said light emitting portion including said nitride III-V group compound semiconductor, said protective film formed on said light emitting portion, wherein said light emitting semiconductor chip is hermetically sealed with an adhesive containing an organic substance, said protective film contains a first dielectric film formed of aluminum oxynitride, a second dielectric film formed of silicon nitride or silicon oxynitride, and a third dielectric film formed of an oxide or a fluoride, said first dielectric film is located more toward said light emitting portion than said second dielectric film, and said second dielectric film is located more toward said light emitting portion than said third dielectric film.

6. The light emitting device according to claim 5, wherein said light emitting semiconductor chip contains a nitride III-V group compound semiconductor.

7. The light emitting device according to claim 5, wherein said light emitting semiconductor chip is a semiconductor laser chip.

8. The light emitting device according to claim 5, wherein said third dielectric film is formed of an oxide, and said third dielectric film is formed of at least one type of oxide selected from the group consisting of aluminum, silicon, hafnium, tantalum, zirconium, niobium, titanium, and yttrium.

9. The light emitting device according to claim 5, wherein said third dielectric film is formed of a fluoride, and said third dielectric film is formed of at least one type of fluoride selected from the group consisting of magnesium and calcium.

10. A manufacturing method of a light emitting device loaded with a light emitting semiconductor chip including an active layer, a light emitting portion, and a protective film, said active layer formed of a nitride III-V group compound semiconductor, said light emitting portion including said nitride III-V group compound semiconductor, said protective film formed on said light emitting portion, the method comprising:
forming a first dielectric film formed of aluminum oxynitride contained in said protective film;
forming a second dielectric film formed of silicon nitride or silicon oxynitride contained in said protective film;
forming a third dielectric film formed of an oxide or a fluoride contained in said protective film; and
loading said light emitting semiconductor chip without hermetically sealing.

11. A manufacturing method of a light emitting device loaded with a light emitting semiconductor chip including an active layer, a light emitting portion, and a protective film, said active layer formed of a nitride III-V group compound semiconductor, said light emitting portion including said nitride III-V group compound semiconductor, said protective film formed on said light emitting portion, the method comprising:
forming a first dielectric film formed of aluminum oxynitride contained in said protective film;
forming a second dielectric film formed of silicon nitride or silicon oxynitride contained in said protective film;
forming a third dielectric film formed of an oxide or a fluoride contained in said protective film; and
hermetically sealing said light emitting semiconductor chip together with an adhesive containing an organic substance and loading the semiconductor chip.

12. The light emitting device according to claim 1, wherein the light emitting portion is a cavity edge in a light emitting side of the semiconductor laser chip, the light emitting side being parallel to a light reflection side of the semiconductor laser chip.

13. The light emitting device according to claim 1, wherein the third dielectric film has an oxygen content of 50 atomic % or more.

* * * * *